United States Patent
Ikeda et al.

(10) Patent No.: US 6,774,720 B2
(45) Date of Patent: Aug. 10, 2004

(54) ELECTRIC FIELD INTENSITY DETECTING CIRCUIT AND LIMITER AMPLIFIER

(75) Inventors: Takeshi Ikeda, Tokyo (JP); Hiroshi Miyagi, Kanagawa (JP)

(73) Assignee: Niigata Seimitsu Co., Ltd., Niigata (JP)

(*) Notice: Subject to any disclaimer, the term of this patent is extended or adjusted under 35 U.S.C. 154(b) by 0 days.

(21) Appl. No.: 10/405,470

(22) Filed: Apr. 3, 2003

(65) Prior Publication Data

US 2003/0164734 A1 Sep. 4, 2003

Related U.S. Application Data

(63) Continuation of application No. PCT/JP01/08336, filed on Sep. 26, 2001.

(30) Foreign Application Priority Data

Oct. 6, 2000 (JP) ........................................ 2000-308255

(51) Int. Cl.[7] .............................................. H03F 3/45
(52) U.S. Cl. ........................ 330/253; 330/295; 330/310
(58) Field of Search ................................ 330/252, 253, 330/295, 310; 327/309, 352, 563

(56) References Cited

U.S. PATENT DOCUMENTS 4,680,553 A 7/1987 Kimura et al.
6,483,367 B2 * 11/2002 Kohsiek ...................... 327/352

FOREIGN PATENT DOCUMENTS

| JP | 61166207 A | 7/1986 |
| JP | 04084509 | 3/1992 |
| JP | 08125559 A | 5/1996 |

OTHER PUBLICATIONS

International Search Report PCT/JP01/08336, mailed Dec. 25, 2001.

* cited by examiner

Primary Examiner—Steven J. Mottola
(74) Attorney, Agent, or Firm—Connolly, Bove, Lodge & Hutz LLP; Larry J. Hume

(57) ABSTRACT

A second differential amplifier (12) is additionally disposed in parallel with at least a part of first differential amplifiers (11) in respect to a differential amplifying circuit comprising a multi-stage connection of the first differential amplifiers (11) so that a to-be-detected signal may be obtained from the second differential amplifier (12) via a transistor ($Q_i$). Thus, a large current is made to flow through a constant current circuit ($I_{i1}$) which constitutes the first differential amplifier (11) to increase a differential amplification gain. A small current is made to flow through a constant current circuit ($I_{i2}$) which constitutes the second differential amplifier (12), thereby increasing the signal level for detection.

7 Claims, 4 Drawing Sheets

FIG. 1
(CONVENTIONAL)
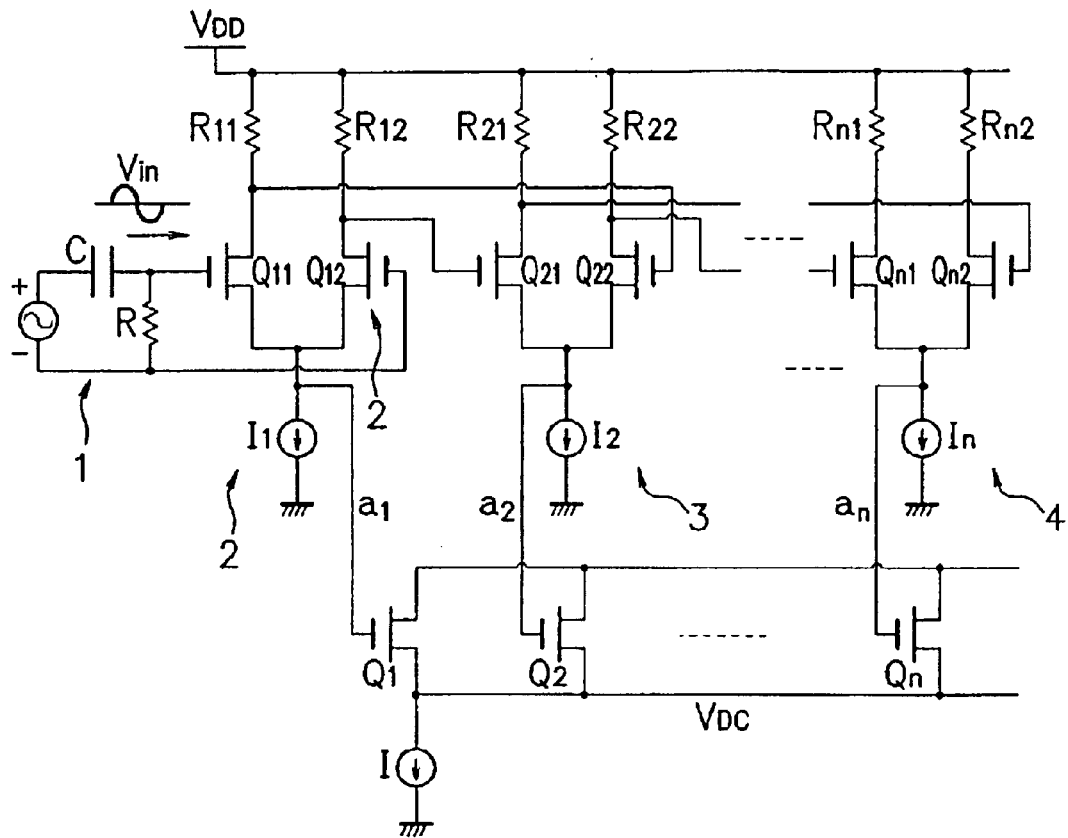

F I G. 4
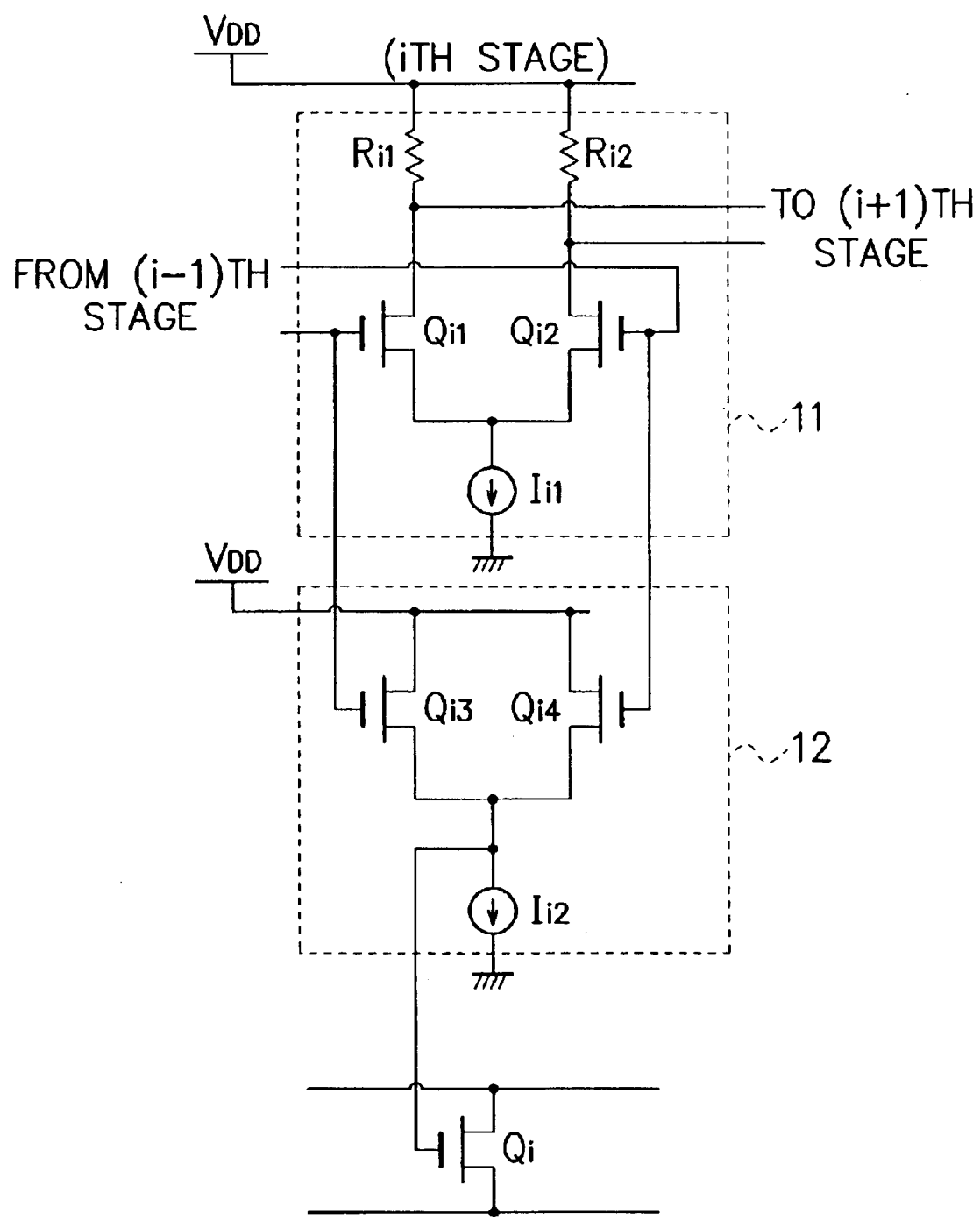

ELECTRIC FIELD INTENSITY DETECTING CIRCUIT AND LIMITER AMPLIFIER

CROSS-REFERENCE TO RELATED APPLICATIONS

This application is a continuing application of co-pending International Application PCT/JP01/08336, filed on Sep. 26, 2001, and published as International Publication WO 02/33860 on Apr. 25, 2002, by Takeshi IKEDA and Hiroshi MIYAGI for "ELECTRIC FIELD INTENSITY DETECTING CIRCUIT AND LIMITER AMPLIFIER", the entire contents of which are hereby incorporated by reference, and for which benefit is claimed under 35 U.S.C. §120, and which, in turn, claims the right of priority under 35 U.S.C. §119 to Japanese Application No. 2000-308255 by the above-named applicants, filed on Oct. 6, 2000.

BACKGROUND OF THE INVENTION

The present invention relates to an electric field intensity detecting circuit and a limiter amplifier and particularly concerns an electric field intensity detecting circuit improved to obtain an electric field intensity detecting signal with preferred linearity and a limiter amplified used for the circuit.

In general, electric field intensity detecting circuits are used for electronic equipment such as a radio receiver, a portable phone, a cordless phone, and a television receiving set that receives and processes a high-frequency signal (RF signal). The electric field intensity detecting circuits detect electric field intensity of a received high-frequency signal and output a DC signal at a level equivalent to the electric field intensity.

FIG. 1 is a diagram showing the configuration of a conventional electric field intensity detecting circuit. In FIG. 1, a high-pass filter 1 on the input stage is constituted by a capacitor C and a resistor R. n differential amplifiers 2, 3, and 4 make multi-stage connection to the post stage of the high-pass filter 1. The n differential amplifiers 2, 3, and 4 making multi-stage connection constitute a limiter amplifier.

The differential amplifiers 2, 3, and 4 are each constituted by a differential pair of two resistors $R_{i1}$ and $R_{i2}$ (i=1 to n) and two transistors $Q_{i1}$ and $Q_{i2}$ (i=1 to n) and a constant current circuit $I_i$ (i=1 to n). Namely, the sources of the two transistors $Q_{j1}$ and $Q_{j2}$ constituting each differential pair are connected in common, and the constant current circuits Ii (i=1 to n) are respectively connected to the common sources. Further, the common sources of the transistors Qi1 and Qi2 are each connected to a constant current circuit I via transistors $Q_i$ (i=1 to n).

Moreover, the drains of the transistors $Q_{i1}$ and $Q_{i2}$ are connected to a power supply VDD respectively via the resistors $R_{i1}$ and $R_{i2}$. Also, except for the differential amplifier 2 on the first stage, an output signal VOUTi (i=1 to n−1) from the differential amplifier on the preceding stage is inputted to the gates of the transistors $Q_{i1}$ and $Q_{i2}$. An input signal $V_{in}$ passing through the high-pass filter 1 is inputted to the gates of the transistors $Q_{11}$ and $Q_{12}$ of the differential amplifier 2 on the first stage.

The above-described transistors $Q_i$ and the constant current circuits I form a part of a detector circuit connected to the post stage of the limiter amplifier. The detector circuit inputs output signals of the n differential amplifiers 2, 3, and 4, smooth the signals, and outputs the signals, so that a DC electric field intensity detecting signal $V_{DC}$ is obtained.

FIG. 2 is a diagram showing input/output characteristics of the electric field intensity detecting circuit, that is, the relationship between the input signal $V_{in}$ (voltage value) and the output signal $V_{DC}$ (voltage value). In the electric field intensity detecting circuit, it is desirable to have preferable linearity as much as possible between a logarithm of an input voltage $V_{in}$ and an output voltage $V_{DC}$. For example, in the case of a radio receiver, it is necessary to have linearity over a wide range of about [dBμ] (1 μV) to 80 [dBμ] (10 mV). For this reason, a plurality of differential amplifiers constituting a limiter amplifier are provided and are connected in multistages, and the differential amplifiers 2, 3, and 4 on the respective stages are adjusted in gain according to a magnitude of current applied to the constant current circuits $I_i$ (i=1 to n).

Namely, in the limiter amplifier configured thus, the signal $V_{in}$ inputted to the transistors $Q_{11}$ and $Q_{12}$ of the differential amplifier 2 on the first stage is amplified by a predetermined level and is outputted. In this circuit, the transistor $Q_{11}$ has an opposite phase output and the transistor $Q_{12}$ has an in-phase output. The amplified and outputted signal is inputted to the bases of the transistors $Q_{21}$ and $Q_{22}$ of the differential amplifier 3 on the second stage, and the signal is further amplified by the differential amplifier 3 and is outputted.

Thereafter, the signal is similarly amplified increasingly by the differential amplifiers 2, 3, and 4 on the respective stages. Hence, the signal $V_{in}$ inputted to the differential amplifier 2 on the first stage increases in amplitude as the signal proceeds to latter stages. However, since signal output levels on the respective stages do not exceed the power supply voltage $V_{DD}$, saturation is made without amplification exceeding a certain level of the signal inputted to each of the stages.

Since a signal inputted to the differential amplifier 4 on the nth stage has the highest level as compared with the other stages, saturation is made most quickly at a low input level. Meanwhile, since a signal input level $V_{in}$ on the first stage is the lowest as compared with the other stages, saturation cannot be made without inputting up to a high-input level. By smoothing output voltages of the differential amplifiers 2, 3, and 4 on the respective stages that have such characteristics, preferable linearity is obtained as much as possible as shown in FIG. 2.

In the case where a differential amplifier constituting a limiter amplifier is provided only on a single stage, when an amplification factor is large, a signal level is immediately saturated, and when an amplification factor is small, it takes a long time to perform amplification to a desired level. Thus, preferable linearity cannot be obtained with respect to the input/output characteristics. Hence, as described above, a plurality of amplifiers 2, 3, and 4 are connected in multi-stages to constitute the limiter amplifier.

In this case, in order to obtain a predetermined gain in each of the differential amplifiers 2, 3, and 4 on the respective stages, current needs to be applied to the constant current circuits Ii (i=1 to n) on the respective stages so as to match the gain. At this point, since the differential amplifier 4 on the nth stage has the largest gain, the corresponding constant current circuit In has to be fed with larger current as compared with the other stages.

However, when current applied to the constant current circuits $I_i$ (i=1 to n) is increased to obtain a large gain, the levels of signals (voltage levels of nodes a1 to an shown in FIG. 1) inputted to the transistors $Q_i$ (i=1 to n) constituting the detector circuit become lower than the original level, resulting in degradation in DC detection efficiency. This will be described below in accordance with FIG. 3.

FIG. 3 is a diagram showing waveforms of signals (signals indicated on the nodes a1 to an) inputted to the gates of the transistors $Q_i$ (i=1 to n). Since the constant current circuit Ii increases in current value with latter stages (the node an side) of the limiter amplifier, as shown in FIG. 3, a signal level on the post-stage side peaks out and becomes lower than the original level. Hence, DC detection efficiency is reduced and a signal remaining AC passes particularly on the post-stage side. Thus, the above-described linearity cannot be obtained.

The present invention is devised to solve such a problem and has as its object the provision of preferable DC detection efficiency while obtaining a large gain of a limiter amplifier having differential amplifiers connected in multistages.

SUMMARY OF THE INVENTION

An electric field intensity detecting circuit comprises a differential amplifier circuit constituted by first differential amplifiers connected in multistages, the first differential amplifiers amplifying an input signal from the preceding stage and outputting the signal to the subsequent stage, and second differential amplifiers arranged only in parallel with some of the n first differential amplifiers on a post-stage side, the n first differential amplifiers constituting the differential amplifier circuit, and a to-be-detected signal is obtained from the second differential amplifiers.

Further, a limiter amplifier of the present invention comprises a differential amplifier circuit constituted by first differential amplifiers connected in multistages, the first differential amplifiers amplifying an input signal from the preceding stage and outputting the signal to the subsequent stage, and second differential amplifiers arranged only in parallel with some of the n first differential amplifiers on the post-stage side, the n first differential amplifiers constituting the differential amplifier circuit.

Since the present invention is achieved by the above technical means, differential amplification is increased in gain by applying large current to the first constant current circuit constituting the first differential amplifier, and the signal level for detection can be increased by applying small current to the second constant current circuit constituting the second differential amplifier. Hence, preferable detection efficiency can be obtained while a large gain is provided for differential amplification.

Further, the second differential amplifiers are arranged only in parallel with some of the n first differential amplifiers, for instance some of the first differential amplifiers on a post-stage side that require particularly a large gain for differential amplification. Thus, it is possible to minimize an increase in the number of elements. With this configuration, while suppressing expansion of a circuit area increased with the number of elements, preferable detection efficiency can be obtained with a large gain for differential amplification.

BRIEF DESCRIPTION OF THE DRAWINGS

FIG. 1 is a diagram showing the configuration of a conventional electric field intensity detecting circuit;

FIG. 4 is a diagram showing a part of the configuration of an electric field intensity detecting circuit according to one embodiment.

DESCRIPTION OF PREFERRED EMBODIMENTS

Figure 2:
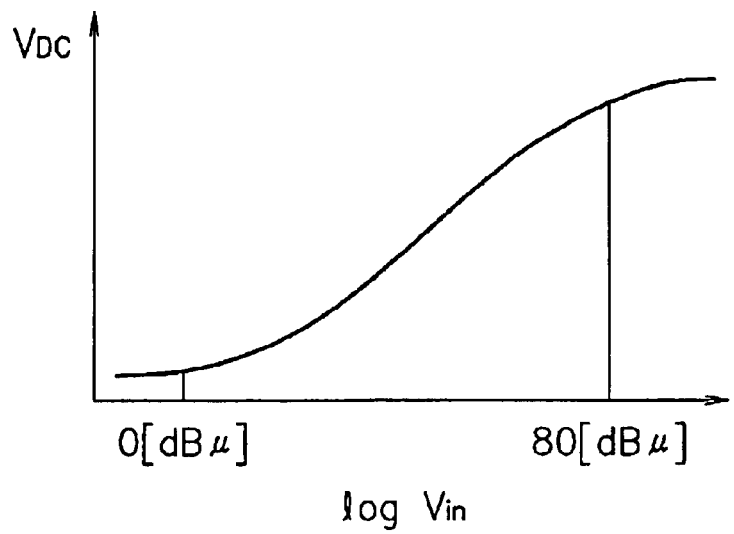
FIG. 2 is a diagram showing input/output characteristics of the electric field intensity detecting circuit.
Figure 3:
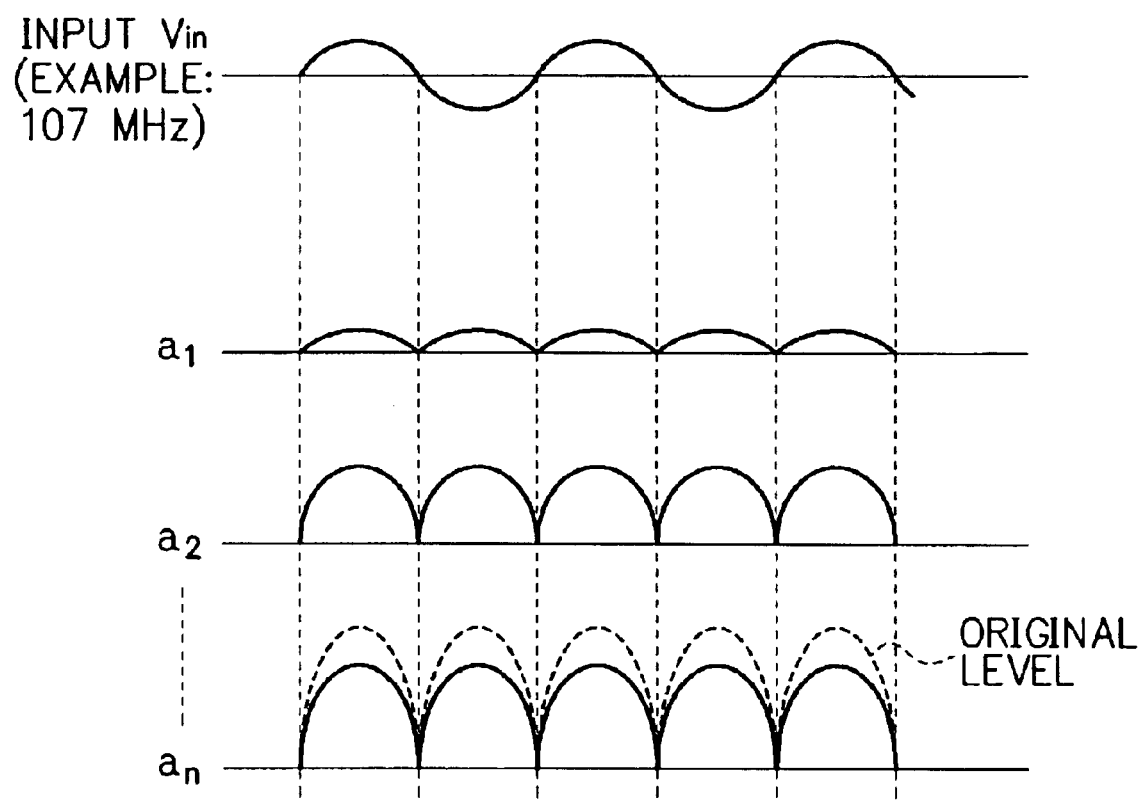
FIG. 3 is a diagram showing waveforms of signals inputted to the gates of transistors Qi.

The following will discuss an embodiment of the present invention in accordance with the accompanied drawing.

FIG. 4 is a diagram showing a part of the configuration of an electric field intensity detecting circuit according to the present embodiment. Although FIG. 4 shows the configuration of ith stage, the similar configuration is connected in multistages until i=1 to n.

As shown in FIG. 4, the electric field intensity detecting circuit of the present embodiment comprises on ith stage a differential amplifier 11 which is constituted by a differential pair of two resistors $R_{i1}$ and $R_{i2}$ and two transistors $Q_{i1}$ and $Q_{i2}$ and a constant current circuit Ii1. The sources of the two transistors $Q_{i1}$ and $Q_{i2}$, which constitute the differential pair, are connected in common, and the constant current circuit $I_{i1}$ is connected to the common source.

Further, the drains of the transistors $Q_{i1}$ and $Q_{i2}$ are each connected to a power supply $V_{DD}$ via the resistors $R_{i1}$ and $R_{i2}$. Moreover, an output signal from a first differential amplifier on the preceding stage (not shown) is inputted to the gates of the transistors $Q_{i1}$ and $Q_{i2}$. Besides, in the case of i=1 (first stage), an input signal $V_{in}$ passing through a high-pass filter 1 of FIG. 1 is inputted to the gates of the transistors $Q_{i1}$ and $Q_{i2}$ of the differential amplifier on the first stage.

The first differential amplifier 11 is similar to differential amplifiers 2, 3, and 4 shown in FIG. 1. In the present embodiment, in addition to the first differential amplifier 11, a second differential amplifier 12 is further provided in parallel. The second differential amplifier 12 is constituted by a differential pair of two transistors $Q_{i3}$ and $Q_{i4}$ and a constant current circuit $I_{i2}$. Namely, the sources of the two transistors $Q_{i3}$ and $Q_{i4}$ constituting the differential pair are connected in common, and the constant current circuit $I_{i2}$ is connected to the common source.

Additionally, the drains of the transistors $Q_{i3}$ and $Q_{i4}$ are each connected to the power supply $V_{DD}$. Further, an output signal from the first differential amplifier on the preceding stage (not shown) is inputted to the gates of the transistors $Q_{i3}$ and $Q_{i4}$. Besides, in the case of i=1 (first stage), the input signal $V_{in}$ passing through the high-pass filter 1 shown in FIG. 1 is inputted to the gates of transistors $Q_{13}$ and $Q_{14}$ of the differential amplifier on the first stage.

In the electric field intensity detecting circuit of the present embodiment, instead of the common sources of the transistors $Q_{i1}$ and $Q_{i2}$ constituting the first differential amplifier 11, the common sources of the transistors $Q_{i3}$ and $Q_{i4}$ constituting the second differential amplifier 12, which is additionally provided in the present embodiment, are connected to the gate of a transistor $Q_i$ constituting a detector circuit.

Further, of the constant current circuits $I_{i1}$ and $I_{i2}$ constituting the two differential amplifiers 11 and 12, a relatively high current is applied to the constant current circuit Ii1 as in the conventional art. Thus, differential amplification can obtain a large gain. Meanwhile, a relatively low current is applied to the constant current circuit $I_{i2}$ of the second differential amplifier 12. Thus, the level of a signal inputted to the gate of the transistor $Q_i$ is not lower than the original level, and preferable DC detection efficiency can be maintained.

Figure 5:
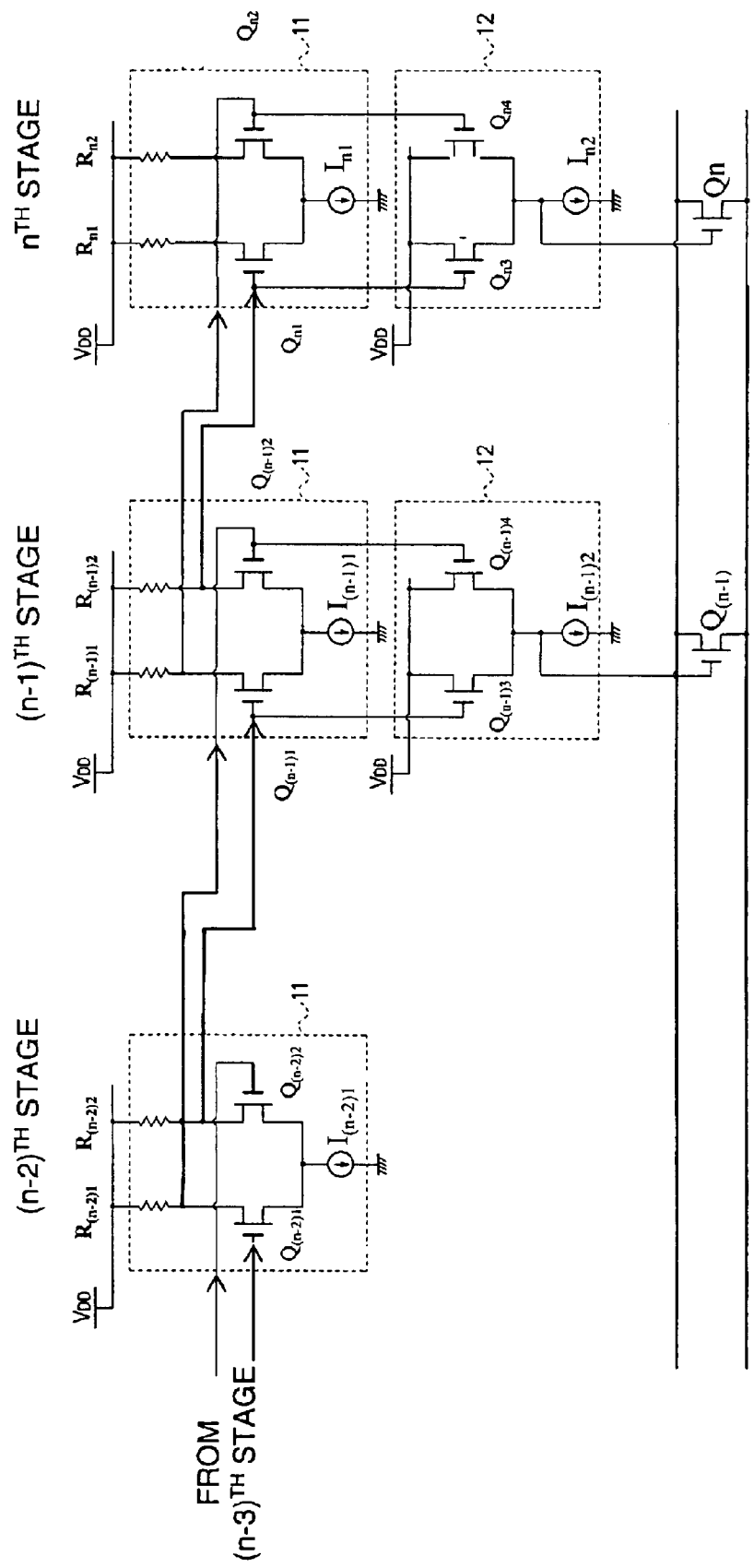
FIG. 5 depicts an embodiment of the invention showing three stages in which at least one stage does not have a second differential amplifier connected in parallel with a first differential amplifier.

As described above, the limiter amplifier of the present embodiment is constituted by connecting the configuration of FIG. 4 in multistages until i=1 to n. The number of connected stages is, for example, 6 to 8. In the present embodiment, although the second differential amplifiers 12 are provided thus on all the stages making multi-stage connection, the second differential amplifiers 12 may be provided at least only on some of the stages. as illustrated in FIG. 5.

In the first embodiment discussed above, the number of elements is larger due to the presence of second differential amplifiers 12, as compared with the conventional electric field intensity detecting circuit. Hence, when all the stages include the second differential amplifiers 12, the number of elements is increased accordingly, and results in a larger circuit area. Hence, the second differential amplifiers 12 are added only on necessary stages, so that the increase in the number of required elements can be reduced.

For example, the post-stage side is larger in differential amplitude gain than the first stage side of the differential amplifiers 11 making multi-stage connection. Thus, the following configuration is applicable: on several stages from the first stage, e.g., the $(n-2)^{th}$ stage shown in FIG. 5, only the first differential amplifiers 11 are provided, and the second differential amplifiers 12 are not provided. In the last two stages, assumed for example, to illustrate the concept, to be the $(n-1)^{th}$ and $n^{th}$ stages, the second differential amplifiers 12 are also provided. With this configuration, and without a large increase in the number of elements, preferable DC detection efficiency can be obtained, while achieving a large differential amplification gain.

Additionally, the above-described embodiment just illustrates an example of a concrete form for implementing the present invention and the technical scope of the present invention should not be interpreted in a limited manner. Namely, the present invention can be implemented in various forms without departing from the spirit or the main characteristics of the invention.

INDUSTRIAL APPLICABILITY

The present invention is useful for obtaining preferable DC detection efficiency while achieving a large gain for a limiter amplifier where differential amplifiers are connected in multistages.

What is claimed is:

1. An electric field intensity detecting circuit, comprising:
   a differential amplifier circuit including plural first differential amplifiers connected in a multistage arrangement,
   the plural first differential amplifiers each amplifying an input signal from a preceding stage and outputting an amplified signal to a subsequent stage; and
   a second differential amplifier comprising two transistors having respective sources connected together at a common source node,
   said second differential amplifier being arranged in parallel with inputs of one of the plural first differential amplifiers, and
   a first constant current source connected between a ground node and the common source node,
   wherein a signal level of a to-be-detected signal is controlled by a first current value of the first constant current source, and
   wherein the to-be-detected signal is obtained from an output of the second differential amplifier.

2. A limiter amplifier, comprising:
   a differential amplifier circuit including plural first differential amplifiers connected in a multistage arrangement,
   each of the plural first differential amplifiers amplifying an input signal from a preceding stage and outputting an amplified signal to a subsequent stage,
   a plurality of constant current sources each connected to a common source node of an associated one of the plural first differential amplifiers; and
   a second differential amplifier arranged in parallel with an input of one of the plural first differential amplifiers,
   wherein at least two of the plurality of constant current sources provide a different constant current value.

3. The electric field intensity detecting circuit of claim 1, further comprising:
   a plurality of second differential amplifiers each connected to an associated one of the plurality of first differential amplifiers,
   wherein each of the plurality of first differential amplifiers comprises two transistors having respective sources connected together at an associated common source node, and
   a second constant current source connected between the ground node and the associated common source node of one of the plurality of first differential amplifiers,
   wherein the second current value is different from the first current value.

4. The electric field intensity detecting circuit of claim 3, wherein the plurality of second differential amplifiers are connected to only a portion of the plurality of first differential amplifiers on a post-stage side of the differential amplifier circuit.

5. The electric field intensity detecting circuit of claim 1, further comprising a second constant current source arranged in at least one of the first differential amplifiers,
   wherein the at least one of the plural first differential amplifiers comprises two transistors having respective sources connected together,
   wherein the second constant current source is connected between the respective sources and a ground node, and
   wherein a gain of the at least one of the first differential amplifiers is determined by a second current value of the second constant current source.

6. The electric field intensity detecting circuit of claim 1, further comprising an output transistor having a gate thereof connected to the common source node of the second differential amplifier.

7. The electric field intensity detecting circuit of claim 1, further comprising a high pass input circuit which provides a filtered input voltage to a first one of the plural first differential amplifiers.

* * * * *